(12) United States Patent
Zitzlsperger et al.

(10) Patent No.: US 9,307,647 B2
(45) Date of Patent: *Apr. 5, 2016

(54) ELECTRONIC DEVICE

(71) Applicant: OSRAM Opto Semiconductors GmbH, Regensburg (DE)

(72) Inventors: Michael Zitzlsperger, Regensburg (DE); Stefan Groetsch, Lengfeld-Bad Abbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 23 days.

This patent is subject to a terminal disclaimer.

(21) Appl. No.: 14/607,993

(22) Filed: Jan. 28, 2015

(65) Prior Publication Data

US 2015/0144985 A1 May 28, 2015

Related U.S. Application Data

(63) Continuation of application No. 13/382,698, filed as application No. PCT/EP2010/058831 on Jun. 22, 2010, now Pat. No. 8,981,238.

(30) Foreign Application Priority Data

Jul. 8, 2009 (DE) .......................... 10 2009 032 253

(51) Int. Cl.
| | |
|---|---|
| H01L 23/48 | (2006.01) |
| H05K 9/00 | (2006.01) |
| H05K 1/18 | (2006.01) |
| H01L 33/48 | (2010.01) |
| H05K 3/34 | (2006.01) |
| H01L 31/0203 | (2014.01) |
| H01L 33/62 | (2010.01) |

(52) U.S. Cl.
CPC ............ *H05K 1/181* (2013.01); *H01L 31/0203* (2013.01); *H01L 33/486* (2013.01); *H05K 3/3442* (2013.01); *H01L 33/62* (2013.01); *H01L 2224/48091* (2013.01); *H01L 2224/48247* (2013.01); *H05K 2201/09181* (2013.01); *H05K 2201/1084* (2013.01); *H05K 2201/10106* (2013.01); *Y02P 70/613* (2015.11)

(58) Field of Classification Search
None
See application file for complete search history.

(56) References Cited

U.S. PATENT DOCUMENTS

| | | | |
|---|---|---|---|
| 5,914,536 A | 6/1999 | Shizuki et al. | |
| 6,872,599 B1 | 3/2005 | Li et al. | |
| 8,981,238 B2 * | 3/2015 | Zitzlsperger et al. | ......... 174/549 |

(Continued)

FOREIGN PATENT DOCUMENTS

| | | |
|---|---|---|
| CN | 1292154 A | 4/2001 |
| CN | 101197357 A | 6/2008 |
| CN | 101276874 A | 10/2008 |
| DE | 102006003931 B3 | 8/2007 |
| GB | 2392778 A | 3/2004 |
| JP | 06048215 U | 6/1994 |
| JP | 2003068921 A | 3/2003 |
| JP | 2003204221 A | 7/2003 |
| JP | 2004241518 A | 8/2004 |
| JP | 2005079372 A | 3/2005 |
| JP | 2008112961 A | 5/2008 |
| JP | 2008182242 A | 8/2008 |
| JP | 2004235564 A | 8/2014 |

*Primary Examiner* — Fernando L Toledo
*Assistant Examiner* — Valerie N Newton
(74) *Attorney, Agent, or Firm* — Slater & Matsil, L.L.P.

(57) ABSTRACT

An electronic device includes a base body, which has a top side and also an underside lying opposite the top side. The base body has connection locations at its underside. An electronic component is arranged at the base body at the top side of the base body. The base body has at least one side area having at least one point of inspection having a first region and second region. The second region is embodied as an indentation in the first region. The first and the second region contain different materials.

17 Claims, 4 Drawing Sheets

(56) References Cited

U.S. PATENT DOCUMENTS

| | | |
|---|---|---|
| 2004/0051171 A1 | 3/2004 | Ng et al. |
| 2005/0110123 A1 | 5/2005 | Waitl et al. |
| 2006/0043566 A1 | 3/2006 | Nakanishi |
| 2007/0170577 A1 | 7/2007 | Dangelmaier et al. |
| 2008/0012036 A1 | 1/2008 | Loh et al. |
| 2008/0142932 A1 | 6/2008 | Beer et al. |
| 2008/0144334 A1 | 6/2008 | Shin et al. |
| 2008/0237627 A1 | 10/2008 | Kobayakawa |

* cited by examiner

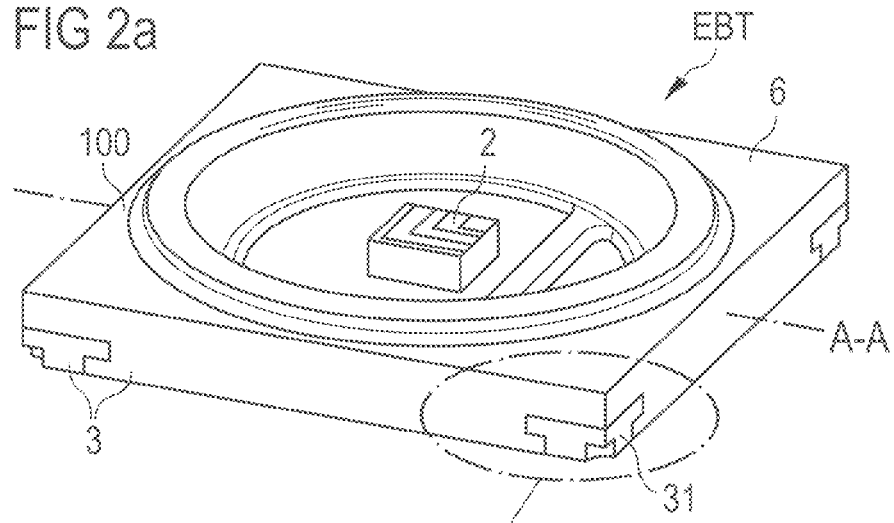
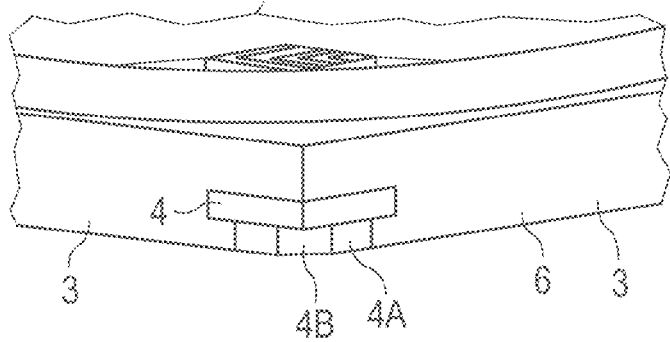
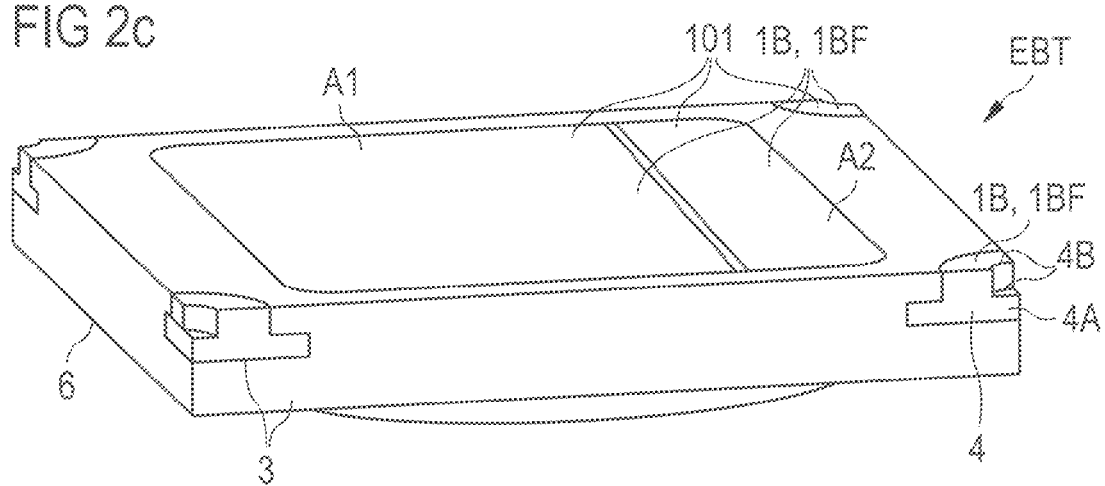

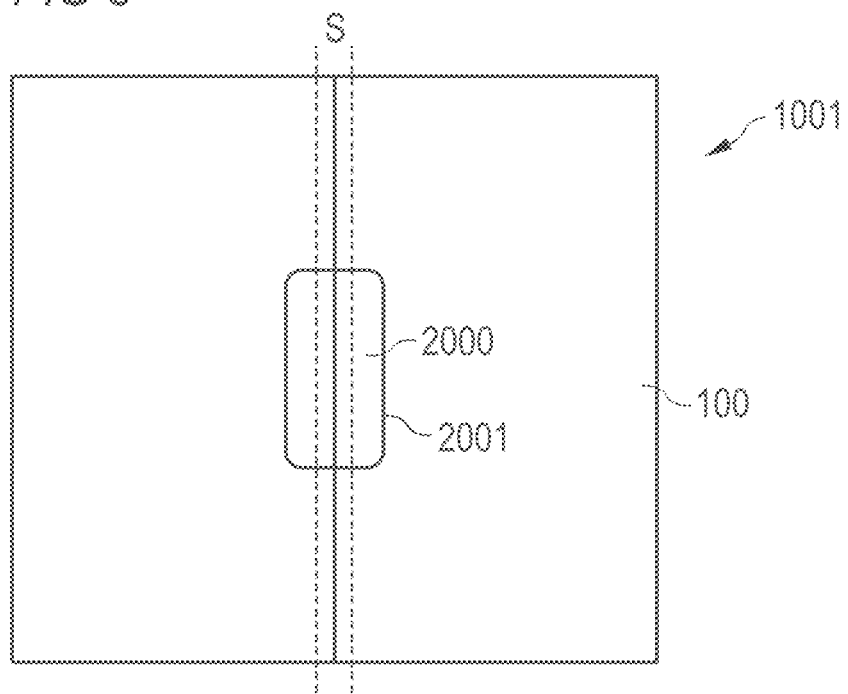
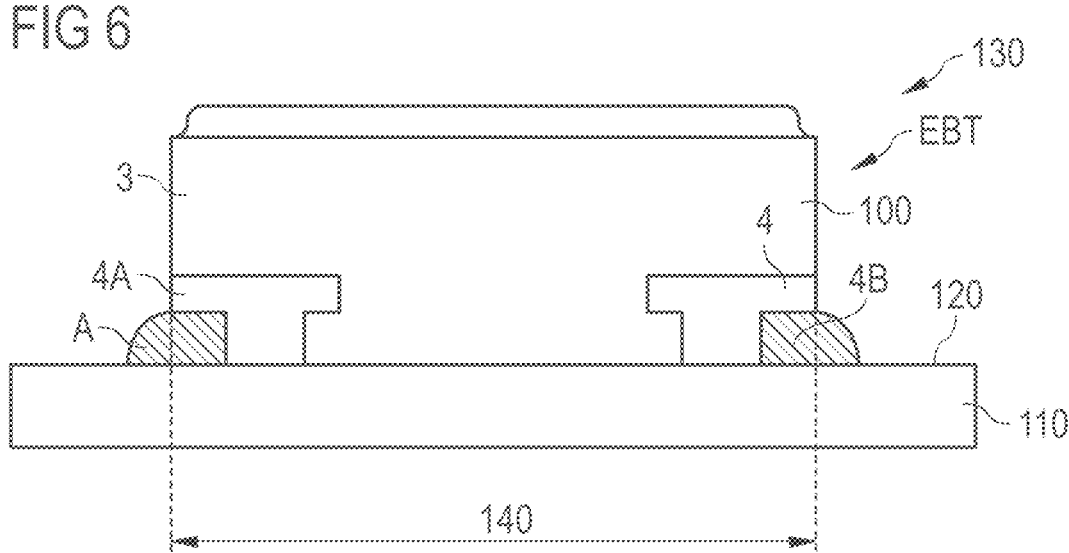

ELECTRONIC DEVICE

This patent application is a continuation of, and claims the benefit of, U.S. patent application Ser. No. 13/382,698, filed on Jan. 23, 2012, titled "Electronic Device," which is a national phase filing under section 371 of PCT/EP2010/058831, filed Jun. 22, 2010, which claims the priority to German patent application 10 2009 032 253.1, filed Jul. 8, 2009, each of which are incorporated herein by reference in their entirety.

TECHNICAL FIELD

An electronic device and also an optoelectronic apparatus comprising an electronic device are specified.

SUMMARY OF THE INVENTION

In one aspect, the invention specifies an electronic device which makes it possible to optically monitor the solder contact of electrical connections of the device.

In accordance with at least one embodiment, the electronic device comprises a base body. By way of example, the base body can be an SMD housing (surface mountable device). The base body has a top side and also an underside lying opposite the top side.

A respective area formed by a part of the outer area of the base body is formed at the top side and the underside. In this case, the area at the underside denotes that outer area of the base body which faces a contact carrier, for example, a printed circuit board in the mounted state.

In accordance with at least one embodiment, the base body has connection locations at its underside. In this case, the connection locations of the device are provided for making electrical contact with the device. Preferably, the connection locations are externally accessible at an underside of the device, wherein the underside of the device is simultaneously the underside of the base body. In other words, electrical contact can be made with the device at the underside of the device.

In accordance with at least one embodiment, an electronic component is arranged at the base body at the top side of the base body. The electronic component can be conductively connected, for example, to the area at the top side of the base body. For this purpose, the electronic component can be bonded, soldered, or electrically conductively adhesively bonded onto the area. The electronic component can be a radiation-receiving or a radiation-emitting semiconductor chip. By way of example, the semiconductor chip is a luminescence diode chip such as, for instance, a light-emitting diode chip or a laser diode chip.

In accordance with at least one embodiment, the base body has at least one side area having at least one point of inspection having a first region and a second region. The side areas are those areas of the device which laterally enclose the area at the underside and extend, for example, in a direction transversely with respect to the area. The side areas extend from the underside to the top side and thus connect the areas at the top side and underside. The at least one point of inspection is preferably externally accessible and freely visible, for example, to an external observer. In this case "freely visible" means that the point of inspection can be optically monitored externally, without parts of the point of inspection being concealed or covered when the device is mounted on a contact carrier. In this context "region" is a surface which shapes and forms the side area at least in places. Preferably, the point of inspection is formed completely by the first and the second region. In other words the point of inspection is part of the side area and is itself subdivided into two regions. The point of inspection is a part of the side area which differs from the rest of the side area, for example, with regard to a material.

In accordance with at least one embodiment, the second region is embodied as an indentation in the first region. In other words the "indentation" is a depression which is, for example, a notch or an indented curve in the first region. The second region is laterally bordered by the first region at least in places. By way of example, the second region is completely enclosed by the first region.

In accordance with at least one embodiment, the first and the second region contain different materials. In this case, "different" means that the materials with which the first and the second region are respectively formed are not identical. By way of example, the second region can differ from the first region by virtue of an additional coating.

In accordance with at least one embodiment of the electronic device, the electronic device has a base body, which has a top side and also an underside lying opposite the top side, wherein the base body has connection locations at its underside. An electronic component is arranged at the base body at the top side of the base body. Furthermore, the base body has at least one side area having at least one point of inspection having a first region and a second region, wherein the second region is embodied as an indentation in the first region. The first and the second region contain different materials.

In this case, the electronic device described here is based on the insight, inter alia, that connection locations arranged at an underside of an electronic device are not visible externally if the electronic device bears on a contact carrier, for example, a printed circuit board. The connection locations are then concealed by a base body of the electronic device. By way of example, the connection locations thus cannot be monitored in respect of whether they are sufficiently wetted with a connection material. Furthermore, it is not possible to ensure whether the connection locations of the electronic device are also electrically contact-connected and/or mechanically connected to the contact carrier.

In order, then, to make the connection locations of the device monitorable with regard to sufficient wetting with the connection material, the device described here makes use of the concept of using a base body having at least one side area having at least one point of inspection. The point of inspection has a first region and a second region.

If both the connection locations and the at least one point of inspection are brought into contact with a connection material and sufficient wetting and physically/chemically stable connection between the connection material and the point of inspection are manifested, then the connection locations are also sufficiently wetted with the connection material and thus electrically and mechanically stably connected to a contact carrier, for example, after curing. Thus, if the electronic device is applied on a contact carrier, then the points of inspection enable, by means of visual monitoring, a statement to be made as to whether the connection locations are likewise sufficiently wetted with the connection material.

In accordance with at least one embodiment, the second region can be wetted with a connection material to a greater extent than the first region. That is to say that the connection material forms a stronger physical and/or chemical bond with the second region than with the first region and the connection material therefore does not "bead off", for example, upon application to the second region. After curing, the connection material is more strongly bonded to the second region, such that, for example, the bonding location between the connection material and the second region withstands greater external mechanical loading than the bonding location between the connection material and the first region. The connection material can be a solder, for example. By way of example, the solder is then formed with a lead-free or lead-containing soldering tin. It is likewise possible for the connection material to be formed with an adhesive. By way of example, the adhesive is a silver conductive adhesive.

In accordance with at least one embodiment, the base body has a metallic carrier. The carrier can be a metallic carrier strip (also called leadframe). By way of example, the carrier strip is then formed with two strip-type metal strips. The metallic carrier can be formed with copper, for example. It is likewise possible for the metallic carrier to be formed with one or more of the materials nickel, palladium, silver or a mixture of these materials together with copper.

In accordance with at least one embodiment, the metallic carrier is covered by a radiation-opaque housing body in places. Preferably, the metallic carrier and the housing body then form the base body. In this context, "covered" means that the housing body is in direct contact with the metallic carrier in places and, therefore, neither a gap nor an interruption is formed at the locations between the metallic carrier and the housing body. In this case, "radiation-opaque" means that the housing body is opaque to electromagnetic radiation impinging on it to the extent of 80%, preferably to the extent of 90%. The housing body can be formed with a thermosetting plastic material or thermoplastic material, for example, an epoxide, or else be formed with a ceramic material or consist of such a material. Additional radiation-absorbing materials, for example, carbon black particles or other fillers can be introduced into the material.

In accordance with at least one embodiment, the housing body mechanically connects the metallic carrier and the point of inspection to one another. A device which is especially stable with respect to external mechanical effects, for example, is advantageously provided in this way. Furthermore, the metallic carrier and the point of inspection can be stabilized in their position with respect to one another by means of the housing body. Furthermore, the housing body is electrically insulating and arranged between the metallic carrier and the point of inspection.

In accordance with at least one embodiment, the metallic carrier and/or the point of inspection are/is at least partly embedded into the housing body. That can mean that the metallic carrier is enclosed by the housing body apart from the connection locations and a mounting region for the electronic component. That is to say that the housing body preferably encloses the connection locations of the device in a positively locking manner at least in places. Preferably, the connection locations then terminate vertically flush with the housing body. In this case "vertically" denotes those directions which run in a plane extending perpendicularly or substantially perpendicularly to the area at the underside of the base body. That is to say that the connection locations are situated at the underside of the base body and do not project beyond the housing body. Preferably, the connection locations in this case have an area through which electrical contact can be made with them from outside the device. At least at the connection area, the connection location is then not enclosed by the housing body.

In accordance with at least one embodiment, the connection locations and the point of inspection are formed with the same material. By way of example, the connection locations and the point of inspection are formed with copper, wherein the connection locations and the point of inspection in the second region are then additionally provided with a metallic coating, for example, a gold or silver coating. If the point of inspection is sufficiently wetted with the connection material in the second region, then this enables a statement to be made regarding the fact that, after the connection locations are additionally brought into contact with the connection material, the connection locations are also sufficiently wetted.

In accordance with at least one embodiment, the base body is formed with a ceramic material. If the base body is formed completely with a ceramic material, then the area at the underside is coated at least in places with a material capable of making electrical contact, for example, a metal, wherein the coated locations then form the connection locations. Furthermore, the base body can then have chip connection locations and also conductor tracks for making contact with the electronic component.

In accordance with at least one embodiment, the at least one side area of the base body is produced by means of singulation in places. In particular, therefore, contour forms of the side area are not produced by a casting or pressing process, but rather by means of a process of singulation of the shaped body. The singulation can be effected, for example, by means of sawing, cutting, milling or producing a breaking edge and subsequent breaking. The side area of the housing body is thus produced by means of material removal. The side area then preferably has traces of material removal. If the base body is formed with the metallic carrier and if singulation, cutting or breaking is effected both through the housing body and through the metallic carrier during the production of the electronic device, then the side areas of the metallic carrier terminate laterally flush with the housing body. In this case "laterally" denotes those directions which run in a plane extending parallel or substantially parallel to the area at the underside. The side area is then formed both by the housing body in places and by the metallic carrier in places. The locations of the carrier through which singulation is effected can then form the point of inspection. Preferably, during singulation, however, singulation is not effected through the second region of the point of inspection, such that the second region has no traces of the singulation, for example, no traces of material removal.

In accordance with at least one embodiment, the first region of the point of inspection is formed with a metal. It is conceivable in this context for the base body to have a metallic carrier.

In accordance with at least one embodiment, the first region of the point of inspection is formed with a ceramic material. Preferably, the base body is then also formed completely with a ceramic material.

In accordance with at least one embodiment, the second region of the point of inspection has a metallic coating. Preferably both the connection locations and the second region of the point of inspection are provided with a metallic coating. Preferably, the metallic coating of the connection locations and of the second region of the point of inspection is formed with the same material. The metallic coating advantageously enables a setting, for an example an increase of the wettability with the connection material. The metallic coating is, for example, a layer formed preferably with silver or gold.

Furthermore, an optoelectronic apparatus comprising an electronic device is specified.

In accordance with at least one embodiment of the optoelectronic apparatus, the optoelectronic apparatus comprises the electronic device in accordance with one of the preceding embodiments.

In accordance with at least one embodiment, the optoelectronic apparatus has a contact carrier, which serves for making electrical contact with the electronic device, wherein at least one mounting region is formed at a surface of the contact carrier. The contact carrier can be a printed circuit board, for example, wherein the mounting region is then that region on which the electronic device is mounted. The mounting region is therefore that region of the surface of the contact carrier which faces the electronic device and on which the electronic device bears. For this purpose, the mounting region can be in mechanical contact with the electronic device at least in places. Preferably, the mounting region is in contact with the connection material via which electrical contact is made with the electronic device. That is to say that the connection material then wets, at least in places, at least the connection locations of the device and therefore also parts of the mounting region.

In accordance with at least one embodiment the second region of the point of inspection is cohesively connected to the mounting region by means of the connection material. In this case, "cohesively" means that after curing of the connection material, the connection material forms a fixed bond with the second region which fixed bond is stable and can be loaded, for example, even with respect to external mechanical loading. Preferably, the connection material then forms a physical and/or chemical bond with the material of the second region, such that neither a gap nor an interruption is formed between the connection material and the second region. In particular, the connection material is connected to the second region in a fracture-resistant manner.

In accordance with at least one embodiment, the points of inspection are freely visible from the surface of the contact carrier. In this case, "freely visible" means that the point of inspection can be visually monitored from that side of the contact carrier which faces the electronic device. By way of example, an external observer can then monitor the point of inspection with respect to whether the connection material is cohesively connected to the second region. If the second region of the point of inspection has been cohesively connected to the connection material, then that means that the connection locations of the electronic device are also cohesively connected to the connection material.

In accordance with at least one embodiment, the material is a solder. If the connection material is a soldering tin, then it is conceivable for the second region of the point of inspection to be provided with a silver or a gold coating. Preferably, in the case of a gold coating, by way of example, onto the metallic carrier formed with copper, by means of a deposition technique, for example, in an electroless fashion, an assemblage of a plurality of layers, for example, in the second region of the point of inspection, is deposited onto the metallic carrier. Preferably, the assemblage follows the layer sequence nickel/palladium/gold proceeding from the metallic carrier in the direction of the connection material. It is likewise conceivable for the layer sequence of the assemblage to be formed with other materials and/or to deviate from the layer sequence presented.

BRIEF DESCRIPTION OF THE DRAWINGS

The electronic device described here and also the optoelectronic apparatus described here will be explained in greater detail below on the basis of exemplary embodiments and with reference to the associated figures.

FIGS. 1a, 1b, 2a, 2b, 2c and 4 show schematic views of exemplary embodiments of an electronic device described here;

FIGS. 3 and 5 each show in schematic plan views a carrier assemblage for producing an electronic device described here; and FIG. 6 shows, in a schematic side view, an exemplary embodiment of an optoelectronic apparatus described here.

In the exemplary embodiments and the figures, identical or identically acting constituent parts are in each case provided with the same reference symbols. The elements illustrated should not be regarded as true to scale; rather, individual elements may be illustrated with different sizes in order to afford a better understanding.

DETAILED DESCRIPTION OF ILLUSTRATIVE EMBODIMENTS

Figure 1A:
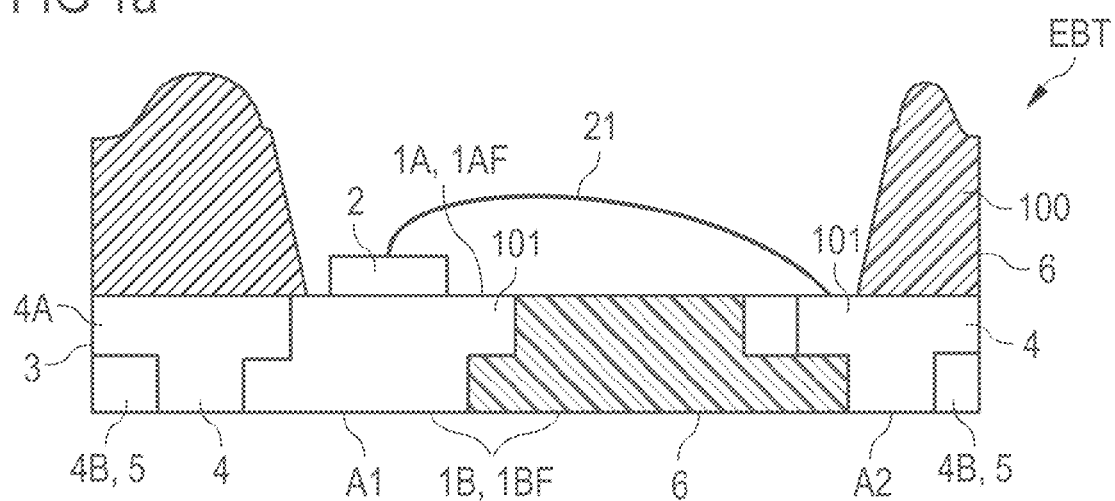

FIG. 1a shows, in a schematic sectional illustration along a sectional line A-A, of FIG. 2a, an exemplary embodiment of an electronic device EBT described here. A base body 100 has a top side 1A and also an underside 1B lying opposite the top side.

Furthermore, the base body 100 has a metallic carrier 101. In this case, the metallic carrier 101 can be formed with copper, for example. Furthermore, the metallic carrier 101 is covered by a radiation-opaque housing body 6 in places. The carrier 101 together with the housing body 6 then forms the base body 100. In accordance with the exemplary embodiment in FIG. 1a, the housing body 6 completely covers an area 1AF at the top side 1A of the base body 100 apart from a chip mounting region. At the underside 1B of the base body 100, the housing body 6 terminates laterally flush with connection locations A1, A2 of the metallic carrier 101. That is to say that an area 1BF at the underside 1B of the base body 100 is planar and, consequently, has neither elevations nor recesses nor interruptions and is determined solely by the form of the base body 100.

The connection locations A1 and A2 serve for making electrical contact with the electronic device EBT. The connection locations A1, A2 are freely accessible from the underside 1B of the base body 100 and in the present case are coated with a material capable of making electrical contact, for example, a silver or gold coating.

An electronic component 2 is arranged on the area 1AF formed in places by the carrier 101. The electronic component 2 is electrically contact-connected to the metallic carrier 101 by means of a bonding wire contact-connection 21. The electronic component 2 can be a radiation-receiving or a radiation-emitting semiconductor chip. By way of example, the semiconductor chip is a luminescence diode chip such as, for instance, a light-emitting diode chip or a laser diode chip.

Furthermore, the base body 100 has side areas 3 produced by means of singulation. The singulation can be effected, for example by means of sawing, cutting, milling, producing a breaking edge and subsequent breaking or some other form of material removal. The side areas 3 of the base body 100 are then produced by means of material removal. The side areas 3 then preferably have traces of material removal. During singulation, it is then the case that singulation is effected both through the housing body 6 and through the metallic carrier 101, such that the side areas 3 are formed in places by the housing body 6 and the metallic carrier 101.

Each side area 3 has a point of inspection 4 having a first region 4A and a second region 4B, wherein the second region is embodied as an indentation 5 in the first region 4A.

In order to make the second region 4B wettable with a connection material, the region 4B is provided with a metallic coating. By way of example, the metallic coating is a coating formed with silver or gold. The metallic coating of the region 4B is the same material with which the connection locations A1, A2 are also coated. In particular, singulation is not effected through the region 4B during singulation, such that the region 4B of the point of inspection 4 has no singulation traces.

Figure 1B:
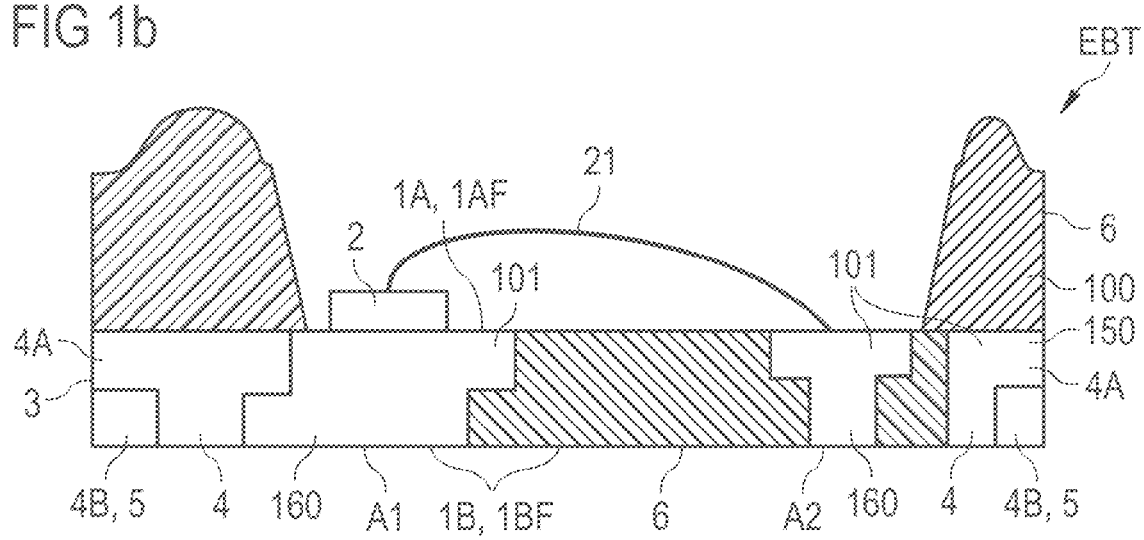

FIG. 1b describes, in a schematic sectional illustration, a further exemplary embodiment in accordance with an electronic device EBT described here, wherein the metallic carrier 101 is formed with two carrier parts 150 and 160 separated from one another. In this case, the carrier part 150 has the point of inspection 4. The housing body 6 is arranged between the carrier parts 150 and 160. The housing body 6 is electrically insulating and mechanically connects the two carrier parts 150 and 160 to one another. What can advantageously be made possible in accordance with this embodiment is that the carrier part 150 having the point of inspection 4 is utilized for making contact with further, for example, external, electronic devices. In particular the present exemplary embodiment makes it possible for the carrier part 160 and the carrier part 150 to be at different electrical potentials and thus for an electrical voltage to be able to be formed between the two carrier parts 150 and 160.

FIGS. 2a, 2b, and 2c show, in schematic plan and side views and also in plan views from the underside, the exemplary embodiment in accordance with FIG. 1a. The point of inspection 4 formed by the first region 4A and the second region 4B can once again be discerned in each case. The second region 4B is formed as an indentation 5 in the first region, wherein the indentation 5 is produced by means of a corner edge 31, formed by two side areas 3 in each case, in the form of a "cylinder-segment-like" depression. In this case, "cylinder-segment-like" means that the indentation 5 is formed by a continuously curved inner area and also a corner inner area running perpendicularly to the inner area.

Figure 3:
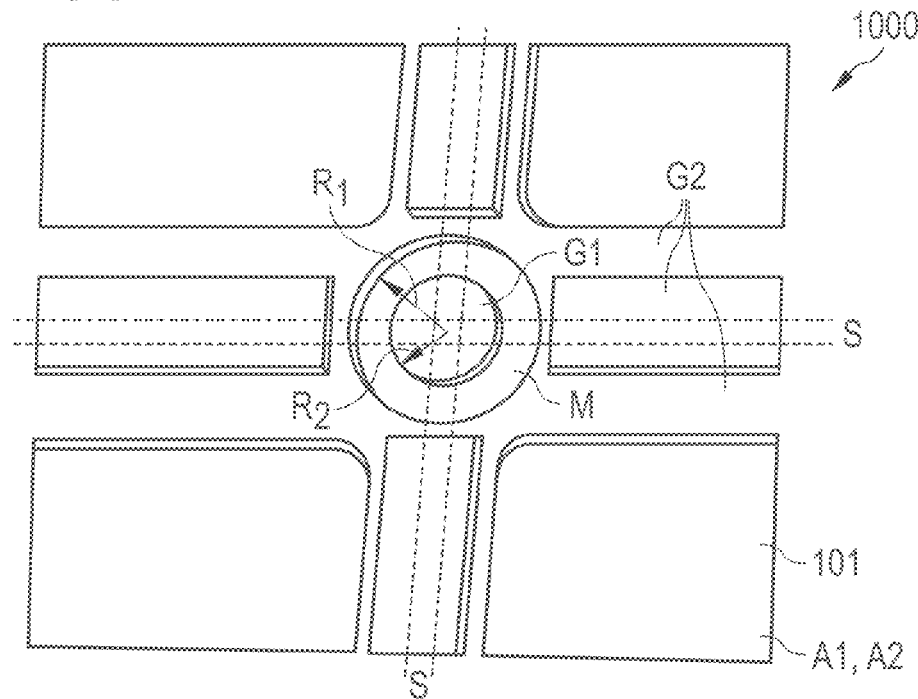

FIG. 3 shows a metallic carrier assemblage 1000 in a schematic plan view. In order to produce the base body 100, housing body material is applied to zones G2 of the carrier assemblage 1000. Preferably, the amount of housing body material applied to the zones G2 is such that, after curing, the housing body material terminates vertically flush both with the connection locations A1, A2 of the later base body 100 and with a ring-shaped cylinder ring M formed by the carrier assemblage 1000. In the carrier assemblage 1000, the connection locations A1, A2 and also the cylinder ring M form elevations in comparison with the surface of the zone G2. The cylinder ring M has an outer radius $R_1$ of 180 to 220 µm, preferably of 200 µm, an inner radius $R_2$ having dimensions of between 80 and 120 µm, preferably of 100 µm.

Preferably, after potting, the zone G1 enclosed by the cylinder ring M in a circular fashion remains free of the housing body material. In a next step, after curing of the housing body material to form the housing body 6, the carrier assemblage 1000 can be singulated into individual base bodies 100 along a cutting line S. After the singulation along the cutting line S, the second region 4B of the point of inspection 4 of an individual metallic carrier 101 in each case arises at the locations of the zone G2. In other words, the cylinder ring M is segmented by the singulation process, such that, after singulation, each metallic carrier 101 in each case has the indentations 5 in the form of "cylinder-segment-like" depressions.

Figure 4:
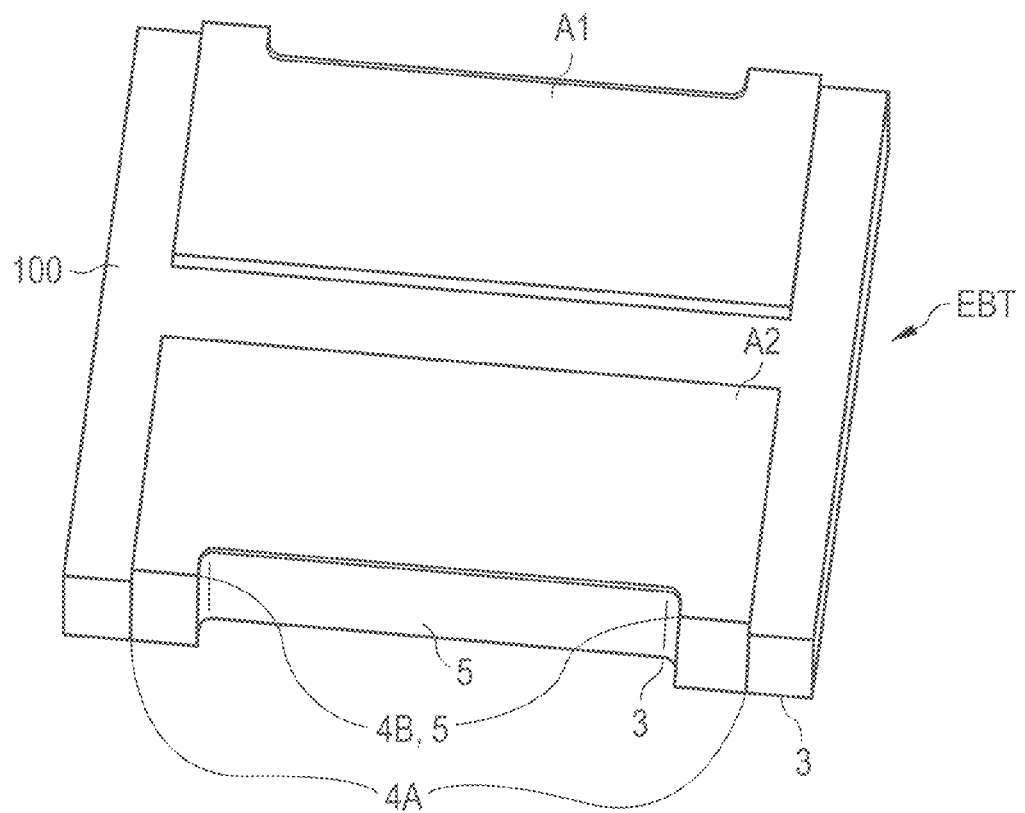

FIG. 4 shows, in a plan view from the underside, a further exemplary embodiment of an electronic device EBT described here. In the present case, the base body 100 is formed with a ceramic material, wherein the base body 100 has connection locations A1 and A2 in this case, too. The connection locations A1, A2 can be formed with a metallic material, for example, with a metallic coating formed with silver or gold, for example. The base body is then provided with conductor tracks and plated-through holes from the underside 1B to the top side 1A, such that the electronic component 2 is electrically contact-connected to the connection locations A1, A2.

As in the preceding exemplary embodiment, the device in accordance with the exemplary embodiment likewise has side areas 3. Furthermore, each side area 3 once again has the point of inspection 4 having the first region 4A and the second region 4B, wherein the second region is embodied as an indentation 5 in the first region 4A.

In the present case, the region 4B embodied as an indentation 5 is coated with a metallic material. This is the same material with which the connection locations A1, A2 are also formed.

FIG. 5 shows a ceramic carrier assemblage 1001 in a schematic plan view. The carrier assemblage 1001 has cutouts 2000 which are free of material and filled with air, for example. Furthermore, inner walls 2001 of the cutouts 2000 have a metallic coating. The metallic coating can be formed with gold or silver, for example. Along the cutting line S, the ceramic carrier assemblage 1001 is singulated into individual base bodies 100. After singulation, the inner walls 2001 are externally accessible and visible. That is to say that, after singulation, through the subdivided cutouts 2001, in each case the second region 4B of a point of inspection 4 is formed in the form of indentations 5.

FIG. 6 shows, in a schematic side view, an optoelectronic apparatus 130 in accordance with an exemplary embodiment described here. On a contact carrier 110, the electronic device EBT is fitted to a surface 120 of the contact carrier 110 on a mounting region 140. The contact carrier 110 can be a printed circuit board, for example, onto which the electronic device EBT is mounted. In this case, the mounting region 140 is that region of the surface 120 of the contact carrier 110 which is in mechanical contact with the electronic device EBT at least in places. The electronic device EBT is both electrically contact-connected and mechanically connected to the contact carrier 110 by means of a connection material A, for example, a solder or an adhesive, via the connection locations A1 and A2. Preferably, the second region 4B of the point of inspection 4 is also cohesively connected to the mounting region 140 by means of the connection material A. That is to say that both at an interface of connection material A/second region 4B and at an interface of connection material A/mounting region 140, neither a gap nor an interruption nor an air inclusion, for example, is formed. The point of inspection 4 is freely visible from the surface 120 of the contact carrier 110.

Since the connection locations A1 and A2 of the device EBT applied to the contact carrier 110 are concealed by the base body 100, the embodiments proposed here of the device EBT claimed here make it possible, by means of the laterally freely visible points of inspection 4, to ascertain whether the connection locations A1 and A2 are cohesively connected to the connection material A and the electronic component is thus sufficiently electrically contact-connected to the contact carrier 110. If the points of inspection 4 are cohesively connected to the connection material A, then this likewise holds true for the connection locations A1 and A2.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims and the exemplary embodiments.

The invention claimed is:

1. An electronic device, comprising:
a base body, which has a top side and an underside lying opposite the top side, wherein the base body has connection locations at its underside; and
an electronic component arranged at the top side of the base body;
wherein the base body has at least one side area having at least one point of inspection with a first region and a second region;
wherein the second region is embodied as an indentation in the first region;
wherein the first region and the second region contain different materials;
wherein the base body has a metallic carrier and the metallic carrier is covered by a radiation-opaque housing body in places so that the metallic carrier together with the housing body forms the base body; and
wherein no parts of the point of inspection are concealed or covered by the housing body or by other components of the base body.

2. The electronic device according to claim 1, wherein the second region is configured to be wetted with a connection material to a greater extent than the first region.

3. The electronic device according to claim 1, wherein the housing body mechanically connects the metallic carrier and the at least one point of inspection to one another.

4. The electronic device according to claim 1, wherein at least one of the metallic carrier and the at least one point of inspection are at least partly embedded into the housing body.

5. The electronic device according to claim 1, wherein the connection locations and the at least one point of inspection are formed with the same material.

6. The electronic device according to claim 1, wherein the at least one side area of the base body is produced by singulation in places.

7. The electronic device according to claim 1, wherein the first region of the at least one point of inspection comprises a metal.

8. The electronic device according to claim 1, wherein the first region of the at least one point of inspection comprises a ceramic material.

9. The electronic device according to claim 1, wherein the second region of the at least one point of inspection has a metallic coating.

10. An optoelectronic apparatus, comprising:
the electronic device according to claim 1; and
a contact carrier in electrical contact with the electronic device, wherein at least one mounting region is formed at a surface of the contact carrier;
wherein the second region of the at least one point of inspection is cohesively connected to the mounting region by a connection material; and
wherein the at least one point of inspection is freely visible from the surface of the contact carrier.

11. The optoelectronic apparatus according to claim 10, wherein the connection material comprises a solder.

12. The electronic device according to claim 1, wherein the electronic component is arranged at a chip mounting region at the top side of the base body.

13. The electronic device according to claim 1, wherein the electronic component is a radiation-receiving or a radiation-emitting semiconductor chip.

14. An electronic device, comprising:
a base body, which has a top side and an underside lying opposite the top side, wherein the base body has connection locations at its underside; and
an electronic component arranged at the top side of the base body;
wherein the base body has at least one side area having at least one point of inspection having a first region and a second region;
wherein the second region is embodied as an indentation in the first region;
wherein the first region and the second region contain different materials;
wherein the first region of the at least one point of inspection comprises a metal or ceramic material;
wherein the second region of the at least one point of inspection has a coating, and wherein a material of the coating is different from the material of the first region;
wherein the coating is a thin layer on the second region so that the second region together with the coating forms an indentation in the first region;
wherein the second region is configured to be wetted with a connection material to a greater extent than the first region;
wherein the base body has a metallic carrier and the metallic carrier is covered by a radiation-opaque housing body in places so that the metallic carrier together with the housing body forms the base body;
wherein the material of the coating is different from the material of the housing body;
wherein the point of inspection is part of the side area of the base body so that the point of inspection is externally accessible and freely visible without parts of the point of inspection being concealed or covered by the housing body; and
wherein the first region of the at least one point of inspection and the housing body terminate flush at the side area of the base body.

15. The electronic device according to claim 14, wherein the housing body mechanically connects the metallic carrier and the at least one point of inspection to one another.

16. The electronic device according to claim 14, wherein at least one of the metallic carrier and the at least one point of inspection are at least partly embedded into the housing body.

17. The electronic device according to claim 14, wherein the connection locations and the at least one point of inspection are formed with the same material.

* * * * *